(12) United States Patent
Ramadan et al.

(10) Patent No.: US 10,366,752 B2
(45) Date of Patent: Jul. 30, 2019

(54) PROGRAMMING FOR ELECTRONIC MEMORIES

(71) Applicant: TECHNION RESEARCH & DEVELOPMENT FOUNDATION LTD., Haifa (IL)

(72) Inventors: Misbah Ramadan, Nazareth (IL); Shahar Kvatinsky, Ramat Gan (IL); Ran Ginosar, Nofit (IL)

(73) Assignee: TECHNION RESEARCH & DEVELOPMENT FOUNDATION LTD., Haifa (IL)

( * ) Notice: Subject to any disclaimer, the term of this patent is extended or adjusted under 35 U.S.C. 154(b) by 0 days.

(21) Appl. No.: 15/834,336

(22) Filed: Dec. 7, 2017

(65) Prior Publication Data
US 2018/0166137 A1    Jun. 14, 2018

Related U.S. Application Data

(60) Provisional application No. 62/432,615, filed on Dec. 11, 2016.

(51) Int. Cl.
*G11C 13/00* (2006.01)
*G11C 11/56* (2006.01)

(52) U.S. Cl.
CPC ...... *G11C 13/0069* (2013.01); *G11C 11/5614* (2013.01); *G11C 13/0061* (2013.01); *G11C 13/0064* (2013.01); *G11C 2211/5621* (2013.01); *G11C 2213/72* (2013.01); *G11C 2213/77* (2013.01)

(58) Field of Classification Search
CPC ................. G11C 11/1675; G11C 13/0069
USPC ................................. 365/148, 158
See application file for complete search history.

(56) References Cited

U.S. PATENT DOCUMENTS

| | | | | |
|---|---|---|---|---|
| 5,764,572 A | * | 6/1998 | Hammick | G11C 7/065 365/185.33 |
| 5,835,412 A | * | 11/1998 | Tran | G11C 27/005 365/185.21 |
| 6,522,594 B1 | * | 2/2003 | Scheuerlein | G11C 7/062 365/105 |
| 6,744,674 B1 | * | 6/2004 | Le | G09G 3/2932 365/185.16 |
| 7,009,882 B2 | * | 3/2006 | Chen | G11O 5/143 365/185.18 |
| 7,099,204 B1 | * | 8/2006 | Wadhwa | G11C 7/067 365/185.02 |
| 7,535,786 B1 | * | 5/2009 | Walker | G01K 7/425 365/222 |
| 7,656,710 B1 | * | 2/2010 | Wong | G11C 11/5628 365/185.19 |
| 7,936,626 B2 | * | 5/2011 | Chen | G11C 7/062 365/189.07 |

(Continued)

*Primary Examiner* — Michael T Tran
(74) *Attorney, Agent, or Firm* — The Roy Gross Law Firm, LLC; Roy Gross

(57) ABSTRACT

Memory circuitry comprises memory cells having two terminals and a feedback path connected between the two terminals. The feedback path is used to adaptively amplify identical programming pulses that serve to change memory states of the memory cell, and the amplification is based on a current resistive level of the memory cell, which may for example be a multi-level memory cell.

10 Claims, 11 Drawing Sheets
(11 of 11 Drawing Sheet(s) Filed in Color)

(56) References Cited

U.S. PATENT DOCUMENTS

| | | | | |
|---|---|---|---|---|
| 8,883,557 B1* | 11/2014 | Hsueh | | H01L 45/08 257/12 |
| 9,042,190 B2* | 5/2015 | Vimercati | | G11C 13/0038 365/196 |
| 9,202,561 B1* | 12/2015 | Park | | G11C 13/0038 |
| 9,646,692 B1* | 5/2017 | Lung | | G11C 13/0069 |
| 9,659,642 B1* | 5/2017 | Nguyen | | G11C 13/004 |
| 2002/0089024 A1* | 7/2002 | Iwata | | B82Y 10/00 257/421 |
| 2002/0159294 A1* | 10/2002 | Kato | | G11C 16/3468 365/185.22 |
| 2004/0008567 A1* | 1/2004 | Furuyama | | G11C 16/3404 365/189.16 |
| 2004/0027907 A1* | 2/2004 | Ooishi | | G11C 11/15 365/226 |
| 2004/0151023 A1* | 8/2004 | Khouri | | G11C 7/04 365/163 |
| 2004/0213047 A1* | 10/2004 | Crippa | | G11C 11/5628 365/185.18 |
| 2005/0030809 A1* | 2/2005 | Vimercati | | G11C 7/067 365/222 |
| 2005/0219914 A1* | 10/2005 | Sarin | | G11C 7/12 365/189.03 |
| 2007/0183207 A1* | 8/2007 | Park | | G11C 8/08 365/185.22 |
| 2007/0211523 A1* | 9/2007 | Kim | | G11C 11/16 365/158 |
| 2008/0165592 A1* | 7/2008 | Kitagawa | | G11C 11/16 365/189.09 |
| 2009/0279345 A1* | 11/2009 | Baker | | G11C 11/16 365/148 |
| 2010/0182820 A1* | 7/2010 | Kitagawa | | G11C 11/56 365/148 |
| 2010/0182861 A1* | 7/2010 | Chen | | G11C 7/062 365/208 |
| 2011/0069539 A1* | 3/2011 | Eleftheriou | | G11C 11/5678 365/163 |
| 2011/0128773 A1* | 6/2011 | Azuma | | G11C 13/0007 365/148 |
| 2012/0051157 A1* | 3/2012 | Nakanishi | | G11C 5/147 365/189.09 |
| 2013/0064008 A1* | 3/2013 | Kim | | G11C 5/145 365/158 |
| 2014/0078820 A1* | 3/2014 | Li | | G11C 13/0004 365/163 |
| 2014/0347912 A1* | 11/2014 | Siau | | G11C 7/062 365/148 |
| 2016/0336062 A1* | 11/2016 | Buchanan | | G11C 11/1673 |
| 2017/0256314 A1* | 9/2017 | Lin | | G11C 13/0069 |

* cited by examiner

PROGRAMMING FOR ELECTRONIC MEMORIES

RELATED APPLICATION/S

This application claims the benefit of priority under 35 USC § 119(e) of U.S. Provisional Patent Application No. 62/432,615 filed on Dec. 11, 2016, the contents of which are incorporated herein by reference in their entirety.

FIELD AND BACKGROUND OF THE INVENTION

The present invention, in some embodiments thereof, relates to programming for electronic memories and, more particularly, but not exclusively, to such programming when applied to resistance based memories, including those with multi-level cells.

Some Multi-Level-Cell memories suffer from nonlinearity in their switching mechanism, and this may be the case with resistive random access, or ReRAM, memory cells. Using fixed programming pulses leads to a non-uniform level distribution and state-dependent programming which burdens the controller and demands a modified programming technique.

In order to deal with such a problem, there are programming methods that propose to apply pre-known programming pulses according to the desired state or perform an iterative program and verify operations. The disadvantage of such programming methods is that they increase both energy and programming latency.

The main limitation of the existing programming solutions is that the controller has to know the desired pulse level value for programming in order to apply the appropriate pulses. Nevertheless, the programming operations lead to high programming latency and energy usage in some cases, and increase complexity due to the higher number of voltage regulators needed to supply different voltage levels. Furthermore, current programming methods must take into account device variations due to imperfections in the fabrication process, and how to control uniform level distribution in order to increase noise margin and process variation tolerance. Applying pre-selected programming pulses may lead to a limited cell capacity caused by the wide level distributions, as a result of not properly taking into account the variations caused by process variations.

Now considered in greater detail, Resistive Random Access Memory (ReRAM) are memory technologies, where data is stored within a resistive switch (memristor) as the resistance of the device. Storing data as resistance rather than electric charge provides for longer retention time since no energy is stored within the cell and therefore the cell cannot leak. Numerous materials have showed memristive behaviour, meaning they have a resistance which can be varied. Suitable ReRAM materials include many oxides and other dielectric materials, and such materials can be used to design ReRAM in a back-end-of-the-line (BEOL) CMOS process, as a cross point between metals. ReRAM therefore has the potential to be extremely dense, and low powered, with high endurance. The change in the memristor resistance is continuous and thus the memory cell can be programmed to different values, which allows the design of multi-level memory cells, cells that store more than a single bit, to increase density.

Reference is now made to FIGS. 1(a)-(b), which is a graph showing resistance behaviour of a memristor under input pulses of different length. Considering the non-linear nature of the memristor dynamic behaviour, resistance levels of the device cannot be uniformly distributed by applying a fixed programming voltage pulse as illustrated in FIG. 1(b). Rather, for a transition between different resistance levels to be successful, several programming steps are required. Different ReRAM programming techniques have been reported in the literature such as staircase programming and program and verify programming (P&V). These programming methods require several programming steps with different voltage pulses for each step. Hence, these techniques suffer from increased latency, energy, and complexity. Furthermore, potential memristor state tuning methods may increase area overhead dramatically, and increase energy usage as well if adopted in ReRAM.

As mentioned, the impact of process variations on resistance level distribution in multi-level control is large. Programming a cell in ReRAM may be achieved by applying a Constant Voltage Stress (CVS) across the cell, for a sufficient amount of time. In Single-Level Cell (SLC), two programming operations may be performed, RESET and SET, which program the cell respectively, from a low resistive state (LRS) to a high resistive state (HRS) and from HRS to LRS. Both RESET and SET are performed using a CVS of Vrst and Vset for a sufficient amount of time, namely, Trst and Tset.

Studies of the effect of RESET and SET operations on the resistance of the cell show that the switching is non-linear in a log-shaped manner as depicted in FIG. 1(a). In Multiple Level Cell (MLC) ReRAM, the levels are represented by different resistances of the cell in addition to the two boundary resistances, namely LRS and HRS. Hence, programming operation in MLC relies on using finer voltage pulses while considering the partitioning of a cell into a certain number of levels. Due to the log-shaped non-linear transition of the memristive device, applying identical voltage pulses changes the resistance in a non-uniform manner across the resistance range as shown in FIG. 1(b), which leads to an increase in erroneous read of cells.

The following discusses the effect of non-linearity on process variation tolerance of the MLC ReRAM, and previously proposed programming methods and their effect on programming latency and energy are discussed.

Controlling Uniformity of Level Distribution

Imperfections in the fabrication process of memristors may cause different cells within the memory array to behave slightly differently from each other. Denote a cell that can store N values within a N-level cell, and k bits per cell (2k=N). Due to process variation, each resistance level within the N-levels is represented by a resistance range, rather than a deterministic resistance value, as depicted in FIG. 2(a). The resistance range boundaries of level i are characterized by the slowest and fastest cells in the ReRAM that their resistance is denoted by, respectively, RiS and RiF.

IMPP—Incremental Magnitude Pulse Programming, and ILPP—Incremental Length Pulse Programming are demonstrated in FIGS. 3(a) and 3(b). Both ILPP and IMPP require a read operation prior to programming to adjust the applied pulse to the current and desired states of the memristor. Hence, both techniques are state-pulse dependent techniques. The extra read operation increases programming latency, complicates the voltage generators, and requires the involvement of a controller. Furthermore, pulse-state dependency restricts in-memory multi-valued computing as further discussed hereinbelow.

Another programming method to control uniform level distribution is Program and Verify (P&V). The P&V method relies on applying narrow voltage pulses with consecutively increasing magnitude, combined with read pulses between each programming pulse to verify whether the cell has reached the desired state, as illustrated in FIG. 3(c). In ReRAM, programming operations are usually initiated on a word line, and the controller is responsible for connecting or disconnecting the cells when the desired state is achieved, hence, P&V allows selective programming of cells while controlling tighter resistance level distributions and thus possibly allowing a higher capacity. However, P&V requires more programming iterations as compared to ILPP and IMPP, as well as enhanced participation from the controller, which increases the latency of the programming operation.

Additionally, it has been reported that P&V based on a narrow voltage ramp increases device-to-device variations compared to CVS programming. Hence, it is desired to develop a programming technique with fewer programming iterations and voltage generators (ideally a single applied voltage) for less energy and lower latency. To achieve uniform level distribution by applying identical pulses that correspond to the desired level, the memristor may behave linearly under CVS, as depicted in FIG. 2(c). For example, for N-level cell with linear transition under CVS of length T, a level i can be programmed using i identical pulses of length $T/(N-1)$.

SUMMARY OF THE INVENTION

The present embodiments in their different aspects are a feedback path between the cell ports of a memory cell and a programming method, which relies on applying a constant voltage pulses to uniformly distribute the resistance levels of the memory cell, in particular a ReRAM memory cell and more particularly an MLC ReRAM cell. The embodiments may improve process variation tolerance, and decrease programming steps and hence reduce latency and complexity. Constant voltage write pulses in particular may use feedback as will be described in greater detail hereinafter.

Adaptive programming is a programming method according to the present embodiments, that takes into account the instantaneous state of the programmed cell and modifies programming pulses accordingly, in order to adapt to the cell's state. Adaptive programming relies on a feedback connection that enables online adaptive amplification of programming pulses according to the state of the cell being programmed.

Adaptive programming according to the present embodiments may use feedback-based peripheral circuitry built around the memory cells to adaptively amplify identical programming pulses to suit the current state of the memory cell or cells.

According to an aspect of some embodiments of the present invention there is provided memory circuitry comprising a memory cell having a first terminal and a second terminal, the circuitry further comprising a feedback path between said first terminal and said second terminal.

In an embodiment, said memory cell is a resistive memory cell.

In an embodiment, said feedback path is configured to maintain input programming pulses at a constant voltage.

In an embodiment, said feedback path is configured to maintain input programming pulses at a constant current.

Memory circuitry according to the present embodiments may be part of one or more of: 1T1R, 1D1M, 1S1R, PCM, RRAM, ReRAM, STT-MRAM, CBRAM and Flash memories.

In an embodiment, said memory cell has a number of memory states, said number being at least three.

In an embodiment, said feedback path comprises an operational amplifier and is configured to connect said memory cell in a negative feedback configuration.

In an embodiment, said feedback path is configured to compensate for a slowdown in a resistance transition caused by non-linearity within said memory cell, and thereby to bring about a linear state transition within said memory cell between respective memory states.

In an embodiment, said feedback loop is configured to provide compensation at a beginning of a respective state transition.

An embodiment may further have an input resistor upstream of said feedback loop.

An embodiment may comprise a parallel resistor connected in parallel with both of said feedback loop and said memory cell.

In an embodiment, values for said input resistor and said parallel resistor are selected together to provide voltage compensation across a memory cell resistive range, the memory cell resistive range extending from a low resistive state of said cell to a high resistive state of said cell.

According to a second aspect of the present invention there is provided a method of programming an electronic memory having at least one memory cell, the method comprising obtaining an instantaneous resistive level of the memory cell and modifying a programming pulse to adapt to said instantaneous level.

In an embodiment, said obtaining comprises using a feedback path from said at least one memory cell.

An embodiment may involve carrying out adaptive amplification of said programming pulse according to said instantaneous resistive level.

In a memory cell array comprising at least one memory cell, an aspect of the present invention may relate to the usage of a feedback-based peripheral circuit to adaptively amplify identical programming pulses, the programming pulses being for changing memory states of said at least one memory cell, said amplification being based on a current resistive level of said at least one memory cell.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 1(a) is a graph shown log-shaped reset switching according to the existing art;

FIG. 1(b) illustrates identical pulse programming according to the existing art;

FIG. 2(a) is a graph illustrating different level ranges according to the existing art;

FIG. 2(b) is a graph illustrating non-linear resistance transitions according to the existing art;

FIG. 2(c) is a graph illustrating linear resistance transitions according to the existing art;

FIG. 3(a) illustrates IMPP according to the existing art;

FIG. 3(b) illustrates ILPP according to the existing art;

FIG. 3(c) illustrates program and verify (P&V) according to the existing art;

FIG. 4(a) is a simplified diagram showing a schematic of memory circuitry comprising a memory cell and a feedback loop according to an embodiment of the present invention;

FIG. 4(b) is a simplified diagram showing a variation of the embodiment of FIG. 4(a) with an additional resistor in parallel with the feedback loop FIG. 4(c) is a simplified diagram showing how adaptive programming may linearize transitions of the memristor according to embodiments of the present invention;

FIG. 5 is a simplified diagram showing a schematic of memory circuitry comprising a memory cell and a feedback loop according to an embodiment of the present invention;

Figures 6A, 6B, 6C:
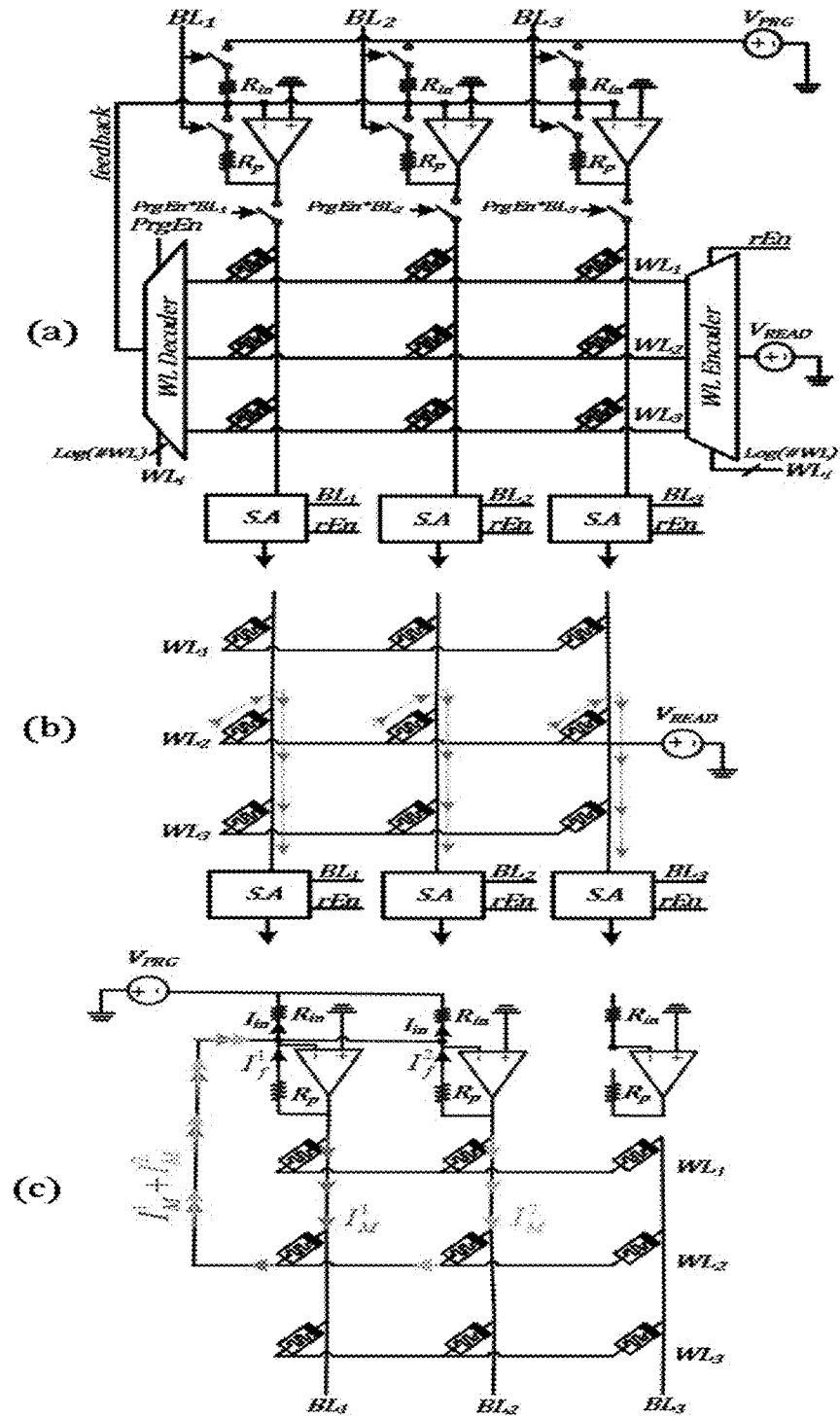
Figure 7:
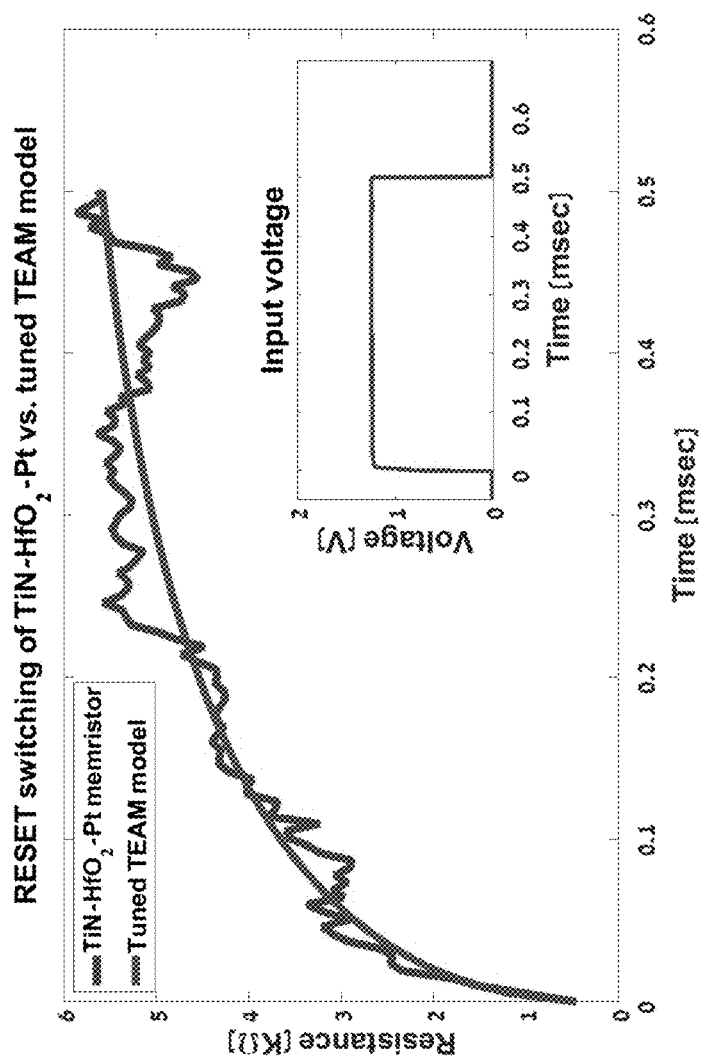
Figures 8A, 8B:
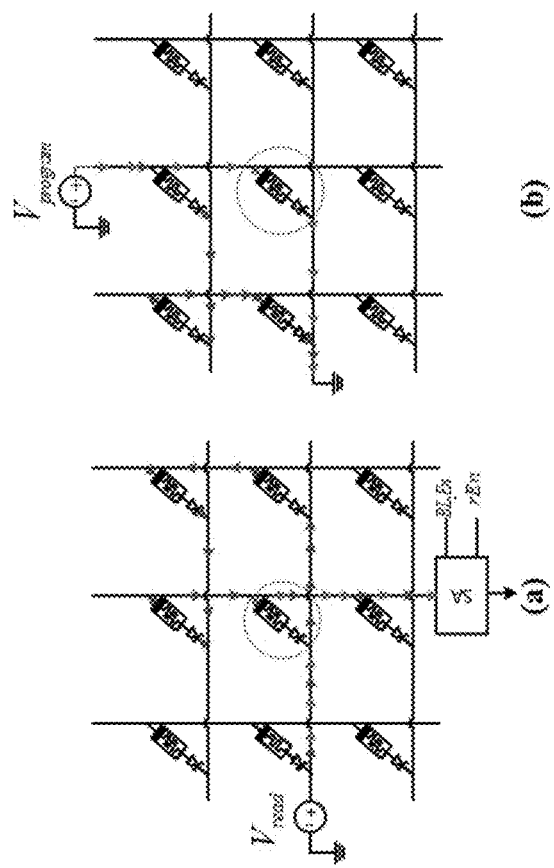
Figures 9A, 9B:
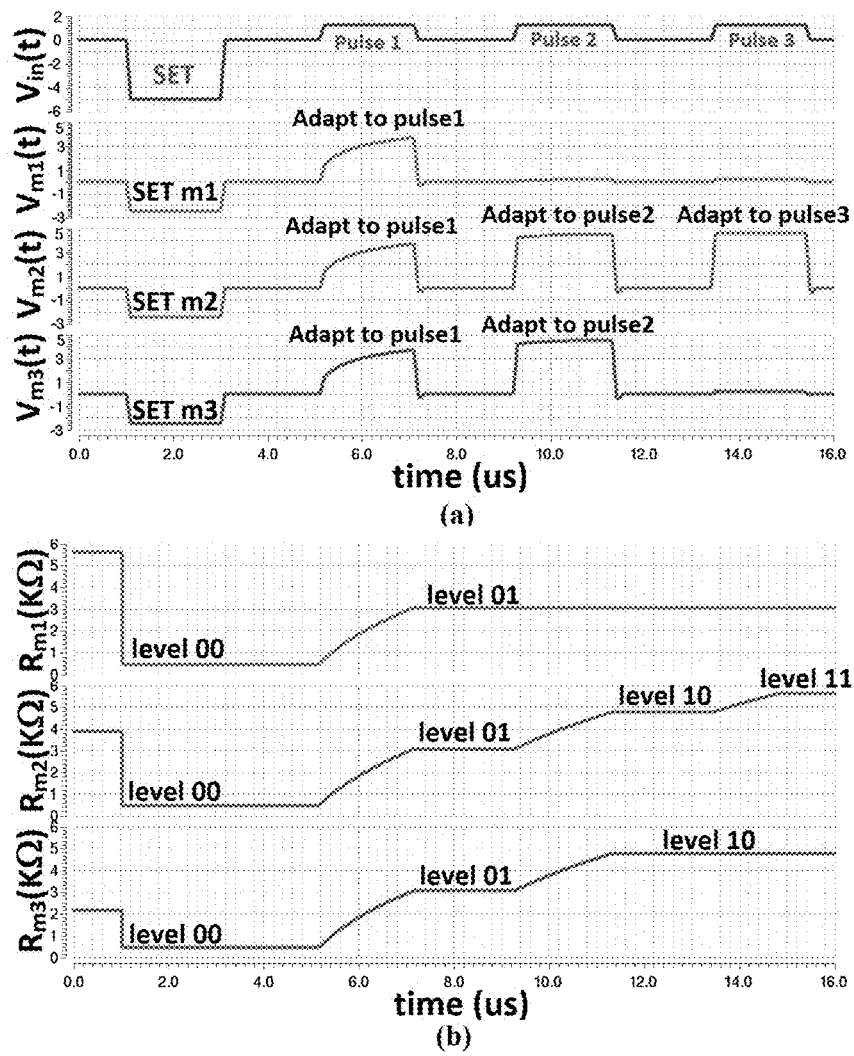
Figures 10A, 10B, 10C:
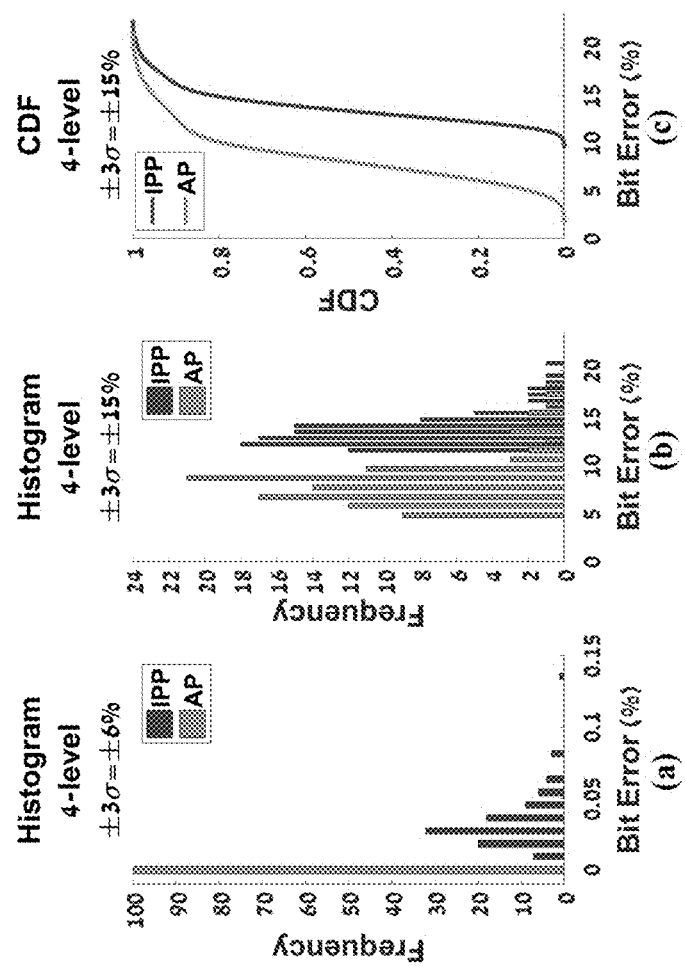
Figure 11:
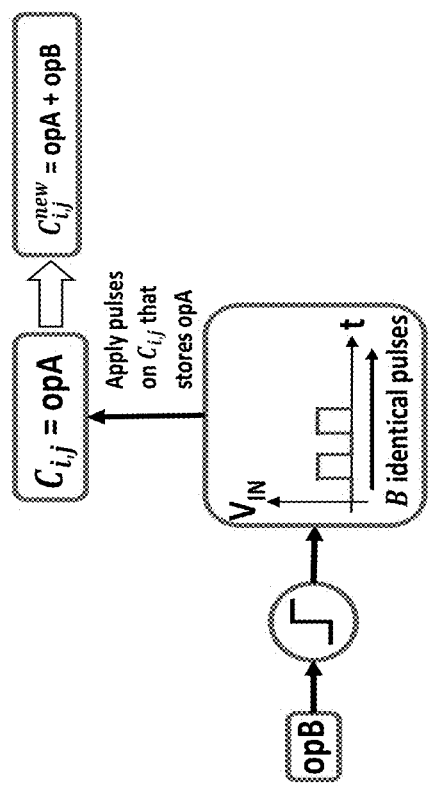

FIG. 6(a) is a simplified diagram showing a 3×3 memristor crossbar with feedback circuits built in according to embodiments of the present invention;

FIG. 6(b) is a simplified diagram showing a parallel read operation of a crossbar such as that in FIG. 6(a);

FIG. 6(c) is a simplified diagram showing a parallel programming or write operation of a crossbar such as that shown in FIG. 6(a);

FIG. 7 is a simplified graph showing the fitting of a model to actual experimental data obtained from a memristor;

FIG. 8(a) is a simplified diagram illustrating sneak paths of a read operation of a cell according to the present embodiments;

FIG. 8(b) is a simplified diagram illustrating sneak paths of a write operation to a cell of the present embodiments;

FIG. 9(a) shows a programming operation being applied to a word line according to the present embodiments;

FIG. 9(b) shows memristor resistance levels during the operation carried out in FIG. 9(a);

FIGS. 10(a) to 10(c) illustrate modeling results using the TEAM model of FIG. 7; and FIG. 11 is a simplified diagram showing a multi-level memristor being used to carry out a simple in memory logic operation according to an embodiment of the present invention.

DESCRIPTION OF SPECIFIC EMBODIMENTS OF THE INVENTION

The present invention, in some embodiments thereof, relates to programming for electronic memories and, more particularly, but not exclusively, to such programming when applied to resistance based memories, including those with multi-level cells.

Resistive RAM (ReRAM) technologies are attractive candidates to replace current non-volatile memory technologies such as NAND Flash. Studies of ReRAM technologies show that their memory cells exhibit a relatively high ratio between low and high resistance states, potentially allowing Multi-Level-Cells (MLC). Unfortunately, the nonlinear behaviour of the resistive devices makes it difficult to control and maintain different resistance levels in MLC. In the present embodiments, the effect of non-linearity on the device tolerance to process variation is addressed by using a methodology referred to herein as Adaptive Programming (AP). AP provides a programming method that improves process variation tolerance, and may reduce the erroneous cell count by 50% in terms of Frequency of Error (FoE) in comparison to Identical Pulse Programming (IIP). The AP method requires fewer programming steps than previously proposed MLC programming techniques such as 'staircase programming' and 'program and verify'. These latter have been shown to result at best in a 46% performance improvement with reduced complexity.

Furthermore, AP may enable in-memory multi-valued computing that can be used in non-von Neumann machines.

The adaptive programming method thus may do away with cell-state-pulse dependency. It also requires no separate verify operations, thus, allowing identical pulse programming while, at the same time, dealing with the nonlinearity impact on memristive devices and MLC level distribution.

The present embodiments may show that adaptive programming is able to control uniformity of level distribution, which increases process variation tolerance. Moreover, since adaptive programming adaptively modifies identical voltage pulses according to the cell's instantaneous state, it no longer requires the support of numerous voltage level sources, namely, no longer requires numerous voltage regulators, which reduces the complexity of the MLC memories.

Adaptive Programming (AP) according to the present embodiments may provide for fixed voltage pulses that may be used to program the memristor to different resistance values, while effectively linearizing the behaviour of the memory cell using a feedback peripheral circuit. The feedback mechanism may transform the fixed voltage pulse into the required applied voltage based on current measurement and on the desired resistance levels in a simple and elegant manner.

AP may improve process variation tolerance by achieving uniformity in the distribution of memristor resistance as compared to previously proposed identical pulse programming (IPP) methods. While AP simplifies the write mechanism for memory applications, the technique may also be used also as a building block for in-memory multi-valued computing.

Figures 1A, 1B:
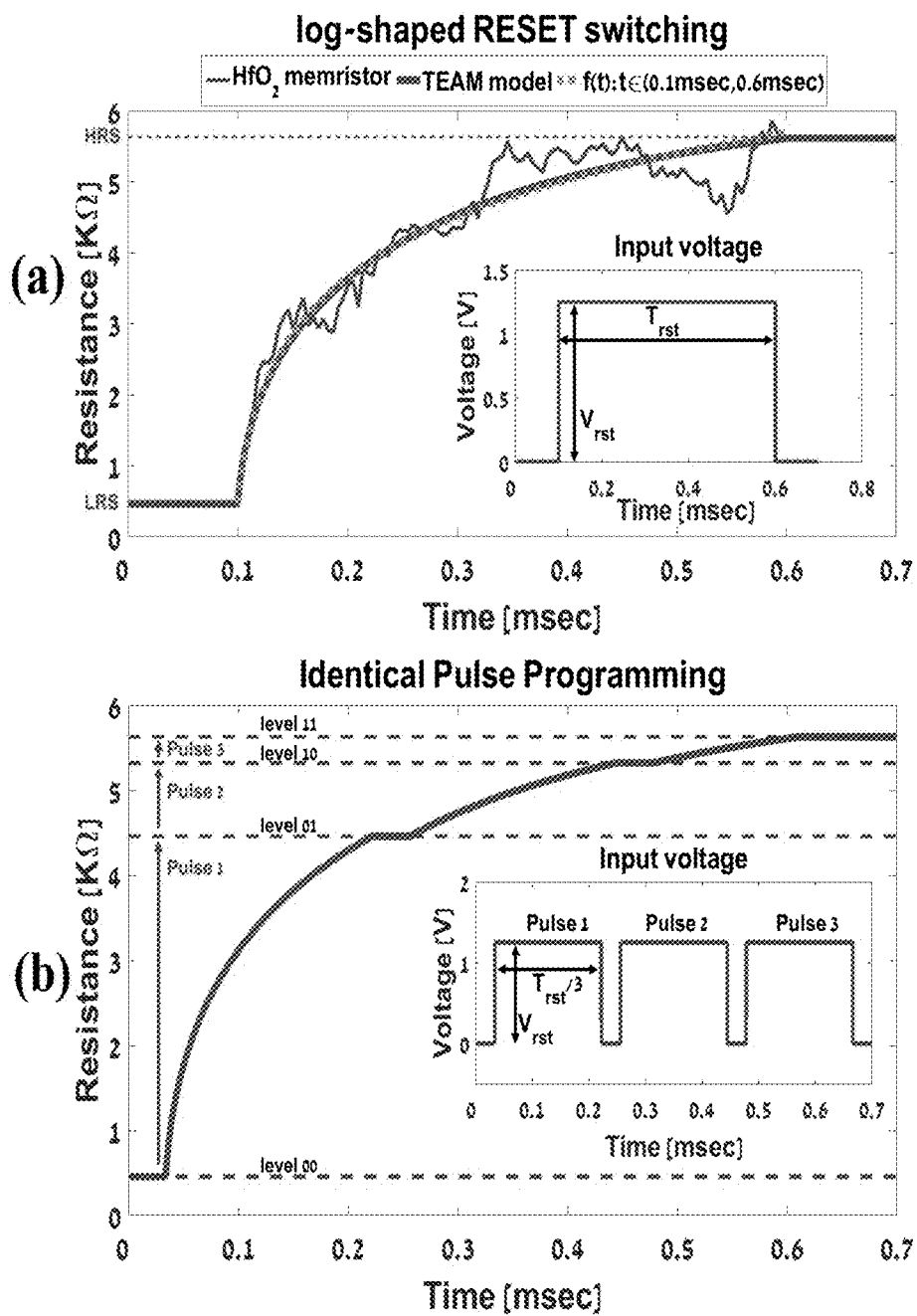

For purposes of better understanding some embodiments of the present invention, as illustrated in FIGS. 4(a)-10(c) of the drawings, reference is now made to the construction and operation of a multi-level memristor cell as illustrated in FIGS. 1(a)-3(c) which were briefly discussed in the background. FIGS. 1(a)-1(b) is a simplified set of two graphs a) and b). FIG. 1(a) shows RESET switching of a tuned memristor model that mimics the physical behaviour of an $HfO_2$ memristor under CVS. FIG. 1(b) shows for the same model how resistance levels are distributed in a non-uniform manner when using identical pulse programming.

Figures 2A, 2B, 2C:
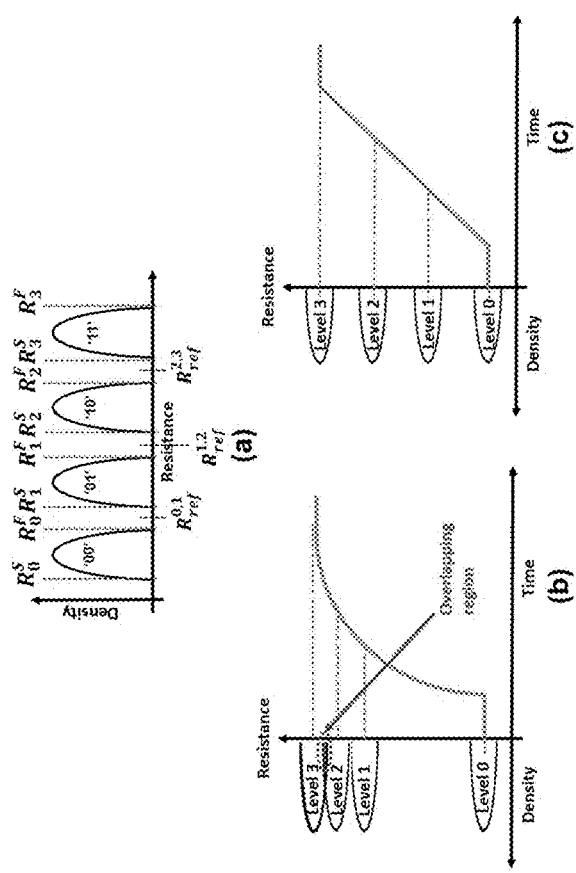

Reference is now made to FIGS. 2(a)-2(c), which is a set of three graphs illustrating the effects of programming pulses on resistance for the same memristor cell. FIG. 2(a) shows how each level i range is necessarily defined by the fastest and slowest cells, respectively, RiF and RiS since each pulse needs to accommodate both the fastest and the slowest cells. Whether the resistance transition of a memristor is (b) non-linear, (c) or linear, determines if the levels are distributed non-uniformly or uniformly when using identical pulses for programming.

Figures 3A, 3B, 3C:
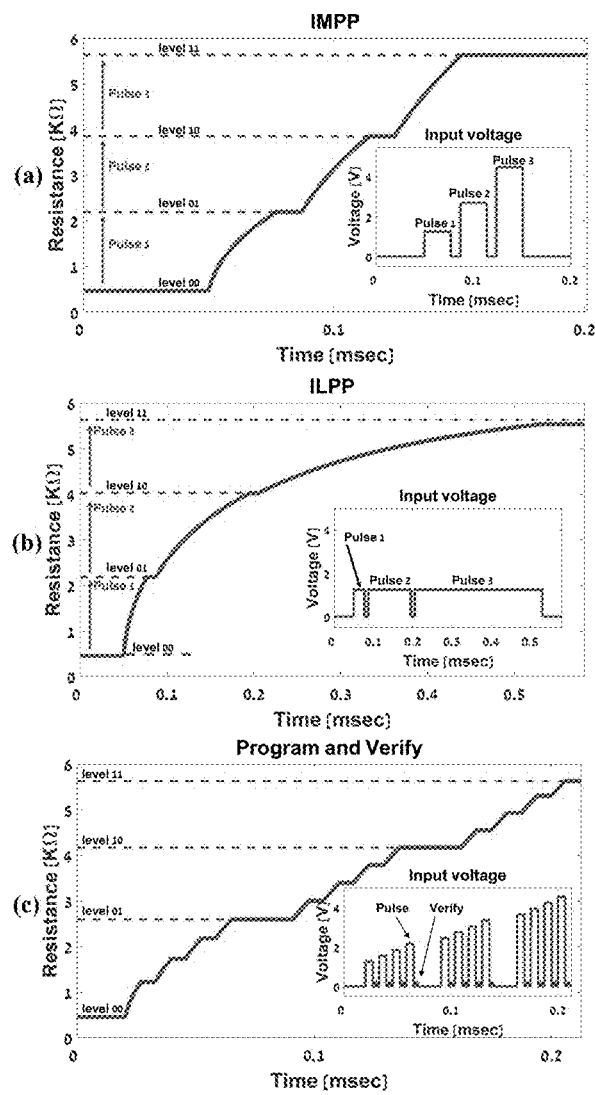

FIGS. 3(a)-3(c) is a set of three graphs illustrating the three different programming methods IMPP, ILPP and Program and Verify, and in each case showing how the programming pulses—shown in inset—affect the resistance of the memristor cell.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figures 4A, 4B, 4C:
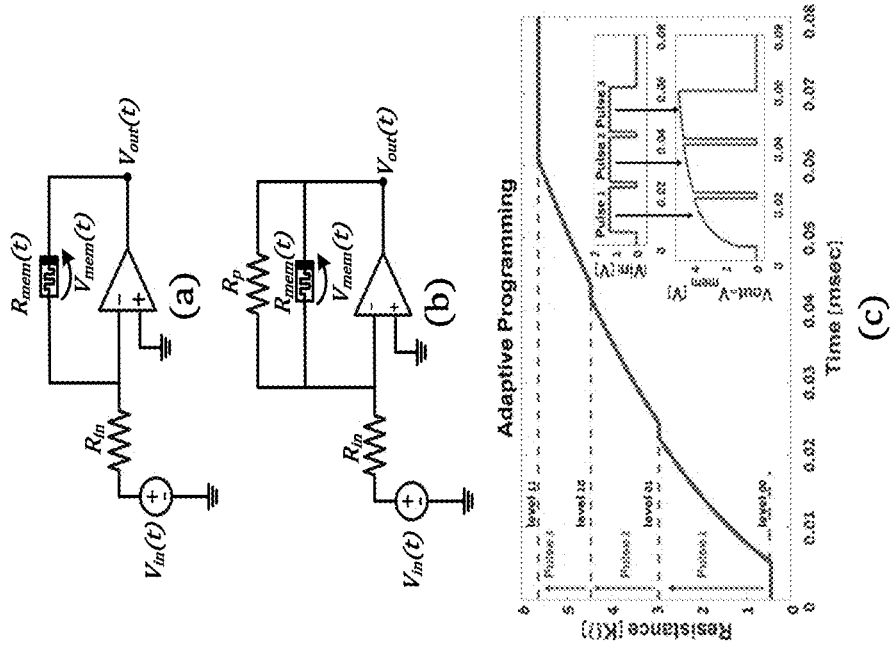

Referring now to the drawings, FIGS. 4(a) and 4(b) illustrate a memory circuit 40 comprising memory cell 42 having a first terminal 44 and a second terminal 46, the circuit having a feedback path 48 between the first terminal 44 and the second terminal 46. The memory cell 42 is typically a cell of a memory array. In an embodiment, the cell 42 is a resistive memory cell, and may be a cell suitable for use in any of 1T1R, 1D1M, 1S1R, PCM, RRAM, ReRAM, STT-MRAM, CBRAM and Flash memories. The feedback path may serve to maintain input programming pulses that are applied to the cell at a constant voltage as will be discussed in greater detail below.

The memory cell may be a multi-level cell, having at least three distinct voltage levels for different memory states, and the feedback path may compensate for a slowdown in a resistance transition caused by non-linearity within the cell, and thereby bring about a linear state transition within the cell between the different memory states.

The feedback path may utilize an operational amplifier 50 connected for negative feedback. Thus the memory cell 42 is connected in a negative feedback configuration, and the feedback loop may provide compensation at the beginning of a state transition.

The circuit may include an input resistor, $R_{in}$—52 upstream of the feedback loop, for example between the input voltage $V_{in}$—54 and the memory cell terminal 44.

A parallel resistor $R_p$—56, shown in FIG. 4(b) but not in FIG. 4(a), may optionally be connected in parallel with both of the feedback loop 48 and the memory cell 42.

Values for the input resistor 52 and the parallel resistor 56 may be selected together to provide voltage compensation across a full memory cell resistive range, that is between the lowest and highest restive states of the cell.

Figure 5:
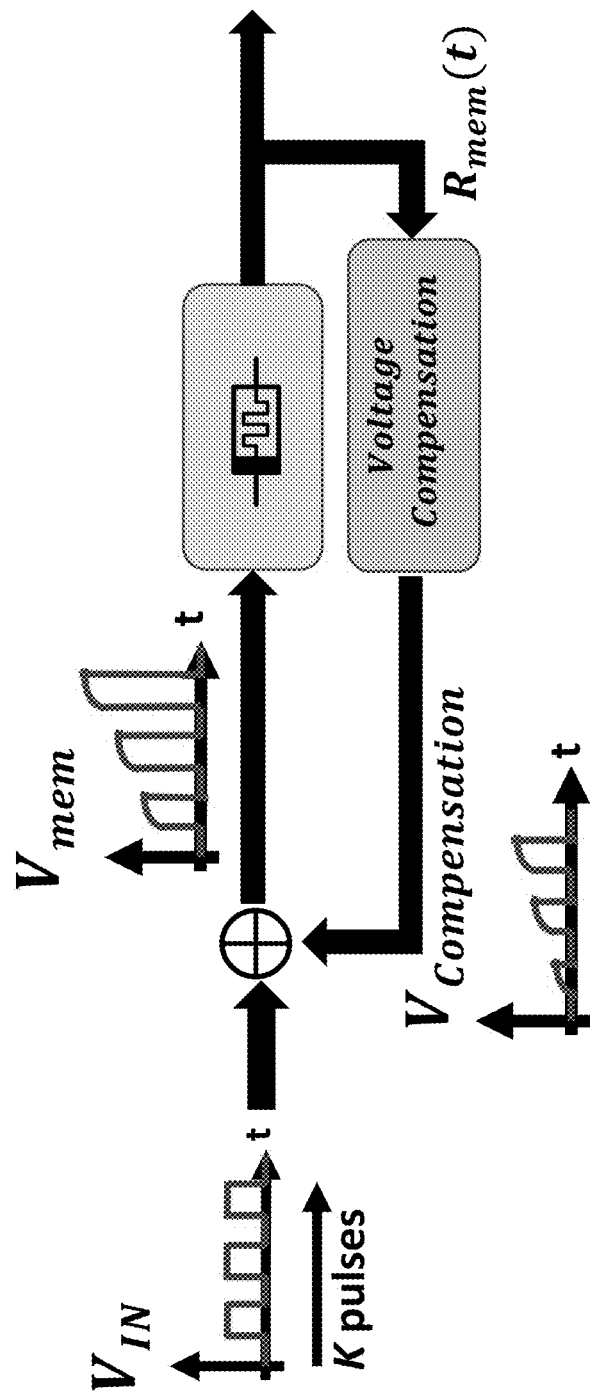

Reference is now made to FIG. 5, which illustrates an abstraction of the memory cell of FIGS. 4(a) and 4(b) with voltage compensation. Voltage pulses 57 are applied and adapted 58 using the feedback path according to the current state of the memristor to provide negative feedback to the original pulses to compensate the slowdown in the resistance transition due to the non-linear behaviour of the device.

Returning to FIGS. 4(b) and 4(c), the authors would like to emphasize that they propose not just a circuit that exhibits a feedback connection for programming, while using identical voltage pulses that are adaptively transformed to appropriate voltage pulses to effectively linearize the resistance transition of a memristive device. FIGS. 4(b) and 4(c) also illustrate how the suggested circuit functionality is also achieved by using identical current programming which effectively achieves the same behavior as the feedback connection with operational amplifiers.

The present circuit, and its current topology (with a feedback connection), can be analyzed from a different perspective, in which the cells are programmed using constant current pulses. Consider the opAmp circuit in FIG. 4(b).

Since $V_+=V_-$ can be assumed to be a virtual short for ideal opAmps the current flowing in $R_{in}$ 52 will be the same current flowing in the feedback through $R_{in} \| R_p$ 44, noting that current cannot flow into the opAmp 50. Since $V_+=0$, therefore $V_-=0$ and the current through $R_{in}$ 52 can be calculated by Ohms low according to:

$$I_{R_{in}}(\rightarrow) = \frac{V_{in}}{R_{in}} = I_{R_p}(t) + I_{mem}(t)$$

Therefore, on the basis of the above perspective, applying constant voltage pulses is equivalent to applying constant current pulses to a cell that consists of a memristive device 42 with a resistor 56 in parallel. And the resistor $R_p$ 56 may be connected such that input for the column is at one side, the side corresponding to the cell, and the other side is connected to ground. Thus, a feedback adaptive connection may be also achieved using identical current programming.

Reference is now made to FIG. 6(a), which illustrates a memory array 60, specifically a 3×3 ReRAM crossbar, in which a feedback-based peripheral circuit 62 may be used to adaptively amplify generally identical programming pulses of the kind shown in FIG. 4(b) and FIG. 5 to provide adaptive programming according to the present embodiments. The programming pulses are themselves for changing memory states of the memory cell, and amplification of the pulses may be based on the instantaneous resistive levels of the individual memory cells 64 of the array.

FIG. 6(b) illustrates functional circuitry for performing a parallel read operation of WL2 which is carried out by setting rEn. The right WL decoder chooses WL2.

FIG. 6(c) illustrates functional circuitry for performing parallel programming, that is a parallel write operation of WL2 using adaptive programming. The parallel write is achieved when PrgEn is set and the left WL decoder chooses WL2.

As mentioned, memory and computing cells based on the present embodiments may include all types of resistive memories in different cell topologies, such as 1T1R, 1D1M, 1S1R, PCM, RRAM, ReRAM, STT-MRAM, CBRAM and Flash memories.

Adaptive Programming (AP) according to the present embodiments is thus a method for programming MLC ReRAM by applying identical voltage pulses and transforming them based on the current state of the cell. Adapting identical applied voltage pulses may compensate the slow-down in the resistance transition caused by the non-linearity of the memristive cell, as shown in FIG. 4(b) and achieves a linear transition under CVS to the programming.

The present embodiments may comprise an AP circuit based on operational amplifiers 68 in inverter configuration with a memristor 64 connected in negative feedback, as shown in FIG. 6(a). Assuming an ideal operational amplifier, the voltage across the memristor is $$V_{mem}(t) = V_{out}(t) = -V_{in} \cdot \frac{R_{mem}(t)}{R_{in}}, \quad (3)$$

where Vin is an input voltage consisting of identical voltage pulses. During programming the voltage across the memristor may be greater than the device threshold, i.e., $$\underbrace{\left| V_{in} \cdot \left( \frac{R_{mem}(t)}{R_{in}} \right) \right|}_{|V_{out}(t)|} > |V_{th}|. \quad (4)$$

The input voltage Vin may thus be limited by the worst case scenario, when the resistance of the memristor is at LRS, namely, (t)/Rin ratio is at a minimum. However, different memristors exhibit different HRS/LRS ratios, and for devices with high HRS/LRS ratio, the amplification of the voltage may reach the saturation voltage of the operational amplifier before a full switch is achieved, namely, Vo(t)>Vcc for Rmem(t)<HRS. The implication is that the present embodiments only enhance the transition at the start, that is when $V_O(t)$<Vcc, and after reaching the saturation voltage the applied voltages on the memristive device are identical, hence the log-shaped transition in the resistance is still present.

To deal with different OFF/ON ratios, another resistor Rp 66 is connected as feedback to the operational amplifier in parallel to the memristor as shown in FIG. 6(a). Thus FIG. 6(a) relates to FIG. 4(b) above. The resistance of both Rin and Rp is selected to achieve voltage compensation across the whole resistance range (i.e., from LRS to HRS) by solving $$\left| V_{in} \cdot \frac{LRS \| R_p}{R_{in}} \right| > |V_{th}|. \quad (5)$$

$$\left| V_{in} \cdot \frac{HRS \| R_p}{R_{in}} \right| > |V_{cc}|. \quad (6)$$

After selecting Rin and Rp, a linear-like transition may be achieved under CVS as depicted in FIG. 4(c).

A circuit for adaptive programming according to the present embodiments may allow the controller to apply identical pulses at the input (i.e., Vin) and adaptively amplify them according to the state of the memristor 64. The adaptive amplification may eliminate the state-pulse dependency between resistance levels and voltage pulses. Furthermore, adaptive programming with identical pulses may distribute the resistance levels uniformly across the resistance range and improve process variation tolerance, while maintaining simplicity of the programming mechanism.

Crossbar Compatibility

The design of Adaptive Programming using operational amplifiers is compatible with crossbar array architecture, which is the base topology underlying ReRAM technologies, and can be feasibly embedded within the ReRAM peripheral circuitry. In crossbar architecture, each cell (i.e., memristor) 64 is placed at a column-row intersection as depicted in FIGS. 6(a)-6(c), as discussed above. A cell can be accessed either for reading or programming by accessing the corresponding column and row of the cell within the crossbar. Read operations are performed by applying a read voltage, which is a voltage that is lower than the memristor threshold, on row i and sensing the current flowing through column j to read the cell located in row i and column j. Write operations are performed by applying a program voltage on column j and connecting row i to the ground. The programming voltage may be greater than the memristor voltage threshold to change the device resistance. In bipolar memristors, the voltage sign (positive or negative) indicates whether the resistance increases or decreases.

To increase performance of the ReRAM, operations may be performed simultaneously for the whole row (i.e., wordline, WL). Reading an entire wordline is performed by applying a read voltage on the wordline and sensing the currents in all of the columns (i.e., bitlines, BLs). Programming operations (either SET or RESET) are also performed in WL granularity, by applying a program voltage on all the bitlines within a WL it is desired to program, and connecting the corresponding WL to the ground.

The AP method involving embedding operational amplifiers within a crossbar design is shown in FIG. 6(a). The read circuitry is similar to conventional ReRAM array topology and supports reading of an entire WL, as indicated by $WL_1$, $WL_2$ etc. Similarly, a parallel programming operation can be performed by implementing operational amplifiers in the peripheral circuitry for each bitline, as shown in FIG. 6(b). A RESET operation is performed simultaneously after a simultaneous SET operation to the whole WL. It is noted that all bitlines $BL_1 \ldots BL_n$ may share the same feedback connection to allow passage for the summation of the current passing out from all the programmed cells, while allowing a corresponding division of the current back to the input of the programmed cells as depicted in FIG. 6(b).

Evaluation

In the following, an operational-amplifier-based adaptive programming method is evaluated and compared to previously proposed programming techniques. Two test environments are built. First, a SPICE based ReRAM is designed and tested in a CMOS 0.18 µm process to verify the functionality of the proposed circuit. Then, a MATLAB based statistical analysis is performed to evaluate the improvement brought about by the AP method under its process variation while considering Frequency of Error (FoE) among ReRAM cells as a figure of merit.

A. Circuit Evaluation

To perform the simulations, the TEAM mode has been selected following a procedure to model the switching dynamics of an $HfO_2$-based memristor, which reportedly has a gradual RESET operation while exhibiting a sub-nanosecond SET operation. The TEAM model was chosen for its non-linear behaviour under CVS, which fits the dynamics of the physical $HfO_2$-based memristor, and reference is now made to FIG. 7, which illustrates fitting of the TEAM model, line 80, to experimental results obtained from an HfO2-based memristor—line 82.

In crossbar arrays, current can sneak, or leak, into different paths other than the desired read or write path. These currents, the sneak or leakage path currents, can cause write disturbs, that is changing cell states undesirably along the sneak paths, or may cause an erroneous read operation due to the increased currents sensed at the sense amplifiers. Several solutions have been proposed in the literature to solve the sneak path problem, such as an unfolded crossbar architecture, diode gating, selectors, Complimentary Resistive Switching (CRS) and half-selected cells. However, considering the different programming schemes in MLC ReRAM that possibly require an increasing magnitude of voltage pulses, some of the known methods may not work as effectively, compared to SLC ReRAM. For example, half-selecting cells may require adaptation to the change in programming voltage to keep other cells half-selected and not causing write disturbs. Such adaptation may increase the complexity of the voltage generators and the peripheral circuitry. CRS is only compatible with SLC ReRAM, while unfolded architecture increases power, latency, and area overhead.

In evaluating the present embodiments, an asymmetrical selector is used to mitigate sneak paths during program and read operations with minimal density and fabrication overhead. The asymmetrical selector exhibits a forward voltage threshold of VF, and a backward voltage threshold of VB, and both reading and programming operations may allow current flow in the desired path for operation, but suppress currents in the sneak paths.

Reference is now made to FIGS. 8(a) and 8(b), which are simplified diagrams illustrating sneak paths—shown by arrows, for the cell indicated by a circle, during reading and programming operations respectively.

Formulating the previous constraint, while considering sneak paths of minimal length of 3, as shown in FIGS. 8(a)—8(b), the constraints are, $$V_F + V_{th} \leq V_{op} \leq 2V_F + |V_B| + 3V_{th}, \text{ for } V_{op} > 0, \quad (7)$$

$$|V_Z| + V_{th} \leq |V_{op}| < 2|V_B| + V_F + 3V_{th}, \text{ for } V_{op} < 0, \quad (8)$$

where Vop is the operational voltage for either reading or programming a cell, VF is the selector's forward voltage, VB is the selector's backward voltage, and Vth is the memristor's threshold voltage. However, using selectors with symmetric characteristics the constraints turn to be, $$V_S + V_{th} \leq V_{op} \leq 3V_S + 3V_{th}, \text{ for } V_{op} > 0, \quad (9)$$

$$V_S + V_{th} \leq |V_{op}| < 3V_S + 3V_{th}, \text{ for } V_{op} < 0, \quad (10)$$

where ±VS is the selector's breakthrough voltage. It can be concluded that using symmetrical selectors may lead to an operational voltage range of |Vopmax|−|Vopmin|=2V_S, in order to assure correct read and program operations. However, the operational voltages when using asymmetrical selectors are restricted to the range of |Vopmax|−|Vopmin|=V_F+|V_B|. Considering the fact that |V_B|>>|V_S|, a much wider range of operational voltages can be used for programming operations using asymmetrical selectors over symmetrical selectors. Therefore the present embodiments may use asymmetrical selectors in 1S1R topology for its feasibility with the different programming methods and for its compatibility with high programming voltages compared to symmetrical selectors.

Simulation results of an adaptive programming of a WL in MLC ReRAM are shown in FIGS. 9(a)-9(b). Prior to programming, a SET operation is applied to the entire WL. Subsequently, identical pulses at the input are applied and are adaptively amplified. The number of identical pulses is determined by the controller according to the desired level and the BL of each cell is disconnected when reaching the desired number of pulses (as per FIGS. 6(a)-6(c)).

We compare different programming methods by SPICE simulations, optimizing the voltage pulse magnitude and length of each method (See Tab. II). For IPP, voltage pulses are chosen to achieve the optimal programming latency at the expense of programming energy, while in ILPP and IMPP, the voltage pulse length and magnitude (within the operational voltage range $V_{op} \in [-5\text{ V}, 5\text{ V}]$) are selected to achieve the best level distribution of a four-level cell resistance. In P&V method, the voltage pulse amplitude or duration trades off the controlled resolution of the resistance levels. Higher or wider voltage pulses increase the resistance steps more rapidly and as a result lower the resolution control. The voltage pulses therefore have been chosen to achieve sufficient accuracy with the aforementioned tradeoff. In AP, $R_{in}$ and $R_p$ resistors are selected to achieve an appropriate voltage pulse amplification.

Energy and latency (per cell) results for different programming methods are listed in Tab. II. Adaptive programming achieves the lowest latency as compared to other programming methods except IPP, improving programming speed by 29% as compared to IMPP. For IPP, voltage pulses were chosen to achieve the lowest programming latency possible (i.e., pulses were chosen with high magnitudes) on the cost of programming energy, however, IPP will still suffer from reliability issues much more compared to AP as it will be discussed in the following sub-section VB.

It is important to note that P&V method also dissipates energy during the verify pulse (i.e., read pulse) after each programming pulse. Since there are a lot of optimizations that can be applied to the read circuitry, we took the best case read energy and latency (1.41 nJ and 1.61 ns in 22 nm) and multiplied it by the number of verify pulses required for the programmed cells to reach levels 1, 2, and 3 (×5, 11, and 17, respectively). The energy and latency figures are extrapolated for a 180 nm process according to scaling estimates, as shown in Table II. Simulations show that AP reduces energy dissipation up to 95% and reduces programming latency by at least 46% compared to P&V.

The present inventors have evaluated the impact of process variation on the level distribution of MLC in different programming techniques. First, the impact of process variations on memristors using the TEAM model has been studied. To add process variations, the present inventors have adopted the methods used to determine the influence of variations in the linear ion drift memristor model.

The TEAM model consists of the two following expressions, $$\frac{dx(t)}{dt} = \begin{cases} k_{off}\left(\frac{i(t)}{i_{off}} - 1\right)^{\alpha_{off}}, & i(t) > i_{off} > 0 \\ 0, & i_{on} \leq i(t) \leq i_{off}, \\ k_{on}\left(\frac{i(t)}{i_{on}} - 1\right)^{\alpha_{on}}, & i(t) < i_{on} < 0 \end{cases} \quad (1)$$

$$R(t) = R_{on} + \frac{(R_{off} - R_{on})}{D} \cdot x, \quad (2)$$

where x ∈[0, D] is an internal state variable, D, $k_{off}$, $\alpha_{off}$, and $\alpha_{on}$ are positive constants, $k_{on}$ is a negative constant, $i_{off}$ and $i_{on}$ are current thresholds, $R_{on}$ and $R_{off}$ are the LRS and HRS, respectively. The current and resistance of the device are, respectively, i(t) and R(t). The resistance of the TEAM model can exhibit, among other I-V relationships, a linear I-V relationship, which is similar to the I-V relationship in the linear ion drift model. Therefore, the same process variation models used for modeling parameter distribution under process variations can be adopted for the TEAM model. In this model, the parameters $R_{off}$, $R_{on}$, and D vary normally, $$R_{off} \sim N(\mu_{R_{off}}, \sigma_{R_{off}}^2), \quad (3)$$

$$R_{on} \sim N(\mu_{R_{on}}, \sigma_{R_{on}}^2), \quad (4)$$

$$D \sim N(\mu_D, \sigma_D^2), \quad (5)$$

where $\mu_{R_{off}}$, $\mu_{R_{on}}$, and $\mu_D$ are, respectively, the desired values of $R_{off}$, $R_{on}$, and D without process variations. $\sigma_{R_{off}}$, $\sigma_{R_{on}}$, and $\sigma_D$ are the standard deviations of, respectively, $R_{off}$, $R_{on}$, and D.

To perform process variations aware simulations, the present inventors built a MATLAB-based Monte-Carlo (MC) simulation environment. As a figure of merit, they selected the Frequency of Error (FoE), which is the number of ReRAM chips suffering from the same number of bit errors (i.e., frequency), while an error refers to erroneous read operation of a cell which was intended to be programmed to level i, but its resistance is lower than $R_{i-1}^F$ (i.e., lower than the fastest cell of the next lower level). They then compared AP to identical pulse programming (IPP) as they both have state-pulse independency and the same underlying programming mechanism which is identical pulses. 10,000 MC samples were sampled and wrapped in 100 iterations (i.e., simulating 100 ReRAM chips) to induce the frequency of bit errors, while considering different deviations for the distributions and the possibility of increasing the cells capacity. For process variation with standard deviation of 2%, adaptive programming completely eliminates the bit errors, as shown in FIG. 10(a). When process variations are more severe, the frequency of errors of adaptive programming is approximately 50% lower (better) than IPP, as shown in FIG. 10(b).

Note that the other programming techniques (i.e., IMPP, ILPP, and P&V) achieve better uniformity with process variations as compared to the proposed design of AP and they practically have a negligible FoE. Since AP outperform these methods and has simpler mechanism, we believe that an upgraded circuit design of AP with better linearity will improve also the uniformity, while maintaining the superior performance. Furthermore, IPP and AP enable in-memory computing since identical pulse programming mechanism is an important block in some of those architectures, as discussed in the following section. The present results show that AP has a clear advantage over IPP in terms of performance, energy and reliability (FoE).

Statistical Analysis

To evaluate the impact of process variation on MLC level distribution, first, the impact of process variation on the memristor has been studied. Since memristors lack a generalized physical model, unlike CMOS transistors, understanding the impact depends on obtaining an exact model and technology. Previous work and efforts have been invested into understanding how to model process variations using memristor model parameters, however, these efforts focus on analyzing the impact of process variations only on the linear ion drift model.

The TEAM model discussed above consists of the two following expressions, $$\frac{dx(t)}{dt} = \begin{cases} k_{off}\left(\frac{i(t)}{i_{off}} - 1\right)^{\alpha_{off}}, & i(t) > i_{off} > 0 \\ 0, & i_{on} \le i(t) \le i_{off} , \\ k_{on}\left(\frac{i(t)}{i_{on}} - 1\right)^{\alpha_{on}}, & i(t) < i_{on} < 0 \end{cases} \quad (11)$$

$$R(t) = R_{on} + \frac{(R_{off} - R_{on})}{D} \cdot x, \quad (12)$$

where x∈[0, D] is an internal state variable, D, $k_{off}$, $\alpha_{off}$, and $\alpha_{on}$ are positive constants, $k_{on}$ is a negative constant, $i_{off}$ and $i_{on}$ are current thresholds, $R_{on}$ and $R_{off}$ are, respectively, the LRS and HRS. (t) and (t) are the current and resistance of the device. The resistance of the TEAM model can exhibit, among other I-V relationships, a linear I-V relationship similar to the I-V relationship in the linear $i_{on}$ drift model. Therefore, the same process variation models for modeling parameters distributions under process variations can be adopted for the TEAM model. In this model, the parameters $R_{off}$, $R_{on}$, and D vary in a normal distribution, $$R_{off} \sim N(\mu_{R_{off}}, \sigma_{R_{off}}^2), \quad (13)$$

$$R_{on} \sim N(\mu_{R_{on}}, \sigma_{R_{on}}^2), \quad (14)$$

$$D \sim N(\mu_D, \sigma_{R_{on}}^2), \quad (15)$$

where $\mu R_{off}$, $\mu R_{on}$, and $\mu D$ are, respectively, the desired values of $R_{off}$, $R_{on}$, and D without process variations. $\sigma R_{off}$, $\sigma R_{on}$, and $\sigma D$ are the standard deviations of, respectively, $R_{off}$, $R_{on}$, and D.

TABLE 1

Tuned Parameters of TEAM model

| | | Physical Device TiN—HfO2—Pt | | |
|---|---|---|---|---|
| | | OFF Region (RESET) | ON Region (SET) | |
| Parameters of TEAM model [15] | $R_{off}$ [Ω] | 5.6K | $R_{on}$ [Ω] | 460 |
| | $k_{off}$ [m/s] | 0.0035 | $k_{on}$ [m/s] | −10 |
| | $a_{off}$ | 1 | $a_{on}$ | 1 |
| | $i_{off}$ [mA] | 0.202 | $i_{on}$ [mA] | −0.14 |
| | $x_{off}$ | 0 | $x_{on}$ = D [m] | $10^{-6}$ |

TABLE II

Energy and Latency Comparison Between Different Programming Methods

| Programming Method | Level 0 (SET)[a] | | Level 1[b] | | Level 2[b] | | Level 3[b] | |
|---|---|---|---|---|---|---|---|---|
| | Energy [fJ] | Latency [nsec] | Energy [nJ] | Latency [μsec] | Energy [nJ] | Latency [μsec] | Energy [nJ] | Latency [μsec] |
| IPP | 106.63 | 8.49 | 17.89 | 1.7 | 26.72 | 2.4 | 33.67 | 3.1 |
| IMPP | | | 4.24 | 2.65 | 12.68 | 5.3 | 24.42 | 7.95 |
| ILPP | | | 5.94 | 2.65 | 14.18 | 12.65 | 25 | 42.65 |
| P&V | | | 146.18 | 3.51 | 348.84 | 7.72 | 515.98 | 11.94 |
| AP | | | 10.64 | 1.9 | 19.6 | 3.8 | 27.18 | 5.7 |

Reference is now made to FIGS. 10(a)-10(c), which illustrates the bit error frequency for identical pulse programming (red) and adaptive programming (green) with standard deviation of (a) σ=2% and (b) σ=5%, and the (c) Cumulative Distribution Function of bit errors, as achieved in a simulation. To perform process-variation-aware simulations we now discuss a MATLAB-based Monte-Carlo (MC) simulation environment. We induce into these simulations a Frequency of Error (FoE), which is the number of ReRAM chips suffering from the same number of bit errors i.e., frequency. An error refers to an erroneous read operation of a cell which was intended to be programmed to level i, but its resistance is lower than $R_{i-1F}$, that is lower than the fastest cell of the previous level. We compare AP to identical pulse programming (IPP) as they both have state-pulse independence and the same underlying programming mechanism of identical pulses. We take 10,000 MC samples and wrap them in 100 iterations, so as to simulate 100 ReRAM chips, to induce the frequency of bit errors, while considering different deviations for the distributions and the possibility of increasing the cell capacity.

For process variation with a standard deviation of 2%, adaptive programming completely eliminates the bit errors, as shown in FIG. 10(a). When more severe process variations occur, adaptive programming decreases the frequency of errors by almost 50%, as compared to IPP, as shown in FIG. 10(b).

It is noted that the present simulations show that the IMPP, ILPP, and P&V methods achieve better uniformity compared to the current implementation of AP. However, AP is shown to be better in terms of performance, energy and complexity compared to these methods and a circuit implementation of AP where better linearity is achieved may achieve the same uniformity while saving energy and increasing performance. Furthermore, IPP and AP allow in-memory computing because of the identical pulse programming mechanism while other methods do not, as discussed in the following section, and furthermore, AP increases reliability by almost 50% in terms of FoE compared to IPP.

Use for in Memory Computing

Reference is now made to FIG. 11, which is a simplified diagram illustrating a way of utilizing the present embodiments to carry out in-memory computing. Modern applications are limited by the bandwidth between the memory and the processor. To increase performance in such cases and reduce the need to transfer data between the memory and the processor, different architectures have been proposed, including non-von Neumann architectures that allow in-memory computing. One possible architecture to perform in-memory computing involves performing multi-valued logic operations within MLC ReRAM. Assume an operand A is stored in cell Ci,j 200, applying a number of identical pulses that corresponds to operand B on cell Ci,j stores the addition result of the two operands (A+B) in cell Ci,j, as illustrated in FIG. 11.

Since AP allows identical pulse programming in MLC ReRAM, while terminating the state-pulse dependency, improving FoE, and increasing the capacity, it may enable an in-memory computing architecture. Logic and architectural challenges may be addressed such as carry handling, defining a new Instruction Set Architecture (ISA), coherency issues, and other control issues of such memories.

General

Memristors can be programmed to use intermediate levels, unlike HRS and LRS, thus allowing the design of MLC ReRAM. Due to imperfections in the fabrication process, memory cells deviate from each other and as a result limit the number of logical levels stored in each cell. Hence, control of uniformity of level distribution in MLC ReRAM may allow for an increase in process variation tolerance and memory capacity.

Adaptive programming (AP) as per the present embodiments, is a programming method which relies on a feedback circuit that amplifies identical voltage pulses according to the current level of the memory cell. AP may decrease latency and energy as compared with other programming schemes with a simpler mechanism. Furthermore, AP reduces the frequency of errors by approximately 50%. Not only does AP improve memory performance, but there is the potential to use the AP programming technique in multi-valued operations, which are useful methods for in-memory computing.

Adaptive programming is a method of programming an electronic memory having at least one memory cell, which involves obtaining an instantaneous resistive level of the memory cell and modifying a programming pulse to adapt to the instantaneous level. The obtaining and the modifying may involve using a feedback path from the memory cell, and adaptive amplification of the programming pulse may be dynamically responsive to the instantaneous resistive level.

It is expected that during the life of a patent maturing from this application many relevant memristor, memory cell, and feedback technologies will be developed and the scopes of the corresponding terms are intended to include all such new technologies a priori.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. Memory circuitry comprising:
    a memory cell having a first terminal and a second terminal, the circuitry further comprising a feedback path between said first terminal and said second terminal,
    wherein said feedback path is configured to compensate for a slowdown in a resistance transition caused by non-linearity within said memory cell, and thereby brings about a linear state transition within said memory cell between respective memory states, and
    wherein said feedback path comprises an operational amplifier and is configured to connect said memory cell in a negative feedback configuration.

2. The memory circuitry of claim 1, wherein said memory cell is a resistive memory cell.

3. The memory circuitry of claim 1, wherein said feedback path is configured to maintain input programming pulses at a constant voltage.

4. The memory circuitry of claim 1, wherein said feedback path is configured to maintain input programming pulses at a constant current.

5. The memory circuitry of claim 1, being part of any one of the group consisting of: 1T1R, 1D1M, 1S1R, PCM, RRAM, ReRAM, STT-MRAM, CBRAM and Flash memories.

6. The memory circuitry of claim 1, wherein said memory cell has a number of memory states, said number being at least three.

7. Memory circuitry comprising:
    a memory cell having a first terminal and a second terminal, the circuitry further comprising a feedback path between said first terminal and said second terminal, and a parallel resistor connected in parallel with both of said feedback loop and said memory cell,
    wherein said feedback path is configured to compensate for a slowdown in a resistance transition caused by non-linearity within said memory cell, and thereby brings about a linear state transition within said memory cell between respective memory states,
    wherein said feedback loop is configured to provide compensation at a beginning of a respective state transition.

8. The memory circuitry of claim 1, further comprising an input resistor upstream of said feedback loop.

9. The memory circuitry of claim 7, wherein values for said input resistor and said parallel resistor are selected together to provide voltage compensation across a memory cell resistive range, the memory cell resistive range extending from a low resistive state of said cell to a high resistive state of said cell.

10. A method for adaptively amplifying programming pulses in at least one memory cell array having at least one memory cell, the method comprising:
    providing a feedback-based peripheral circuit,
    wherein said feedback-based peripheral circuit adaptively amplifies programming pulses for changing memory states of said at least one memory cell, said amplification being based on a current resistive level of said at least one memory cell, and
    wherein said feedback-based peripheral circuit is configured to compensate for a slowdown in a resistance transition caused by non-linearity within said at least one memory cell, and thereby brings about a linear state transition within said at least one memory cell between respective memory states,
    wherein said feedback-based peripheral circuit comprises an operational amplifier and is configured to connect said at least one memory cell in a negative feedback configuration.

* * * * *